United States Patent
Kim et al.

(10) Patent No.: US 6,472,752 B1
(45) Date of Patent: Oct. 29, 2002

(54) FLASH MEMORY DEVICE

(75) Inventors: Bong Kil Kim, Hanam (KR); Sung Mun Jung, Ichon-Shi (KR)

(73) Assignee: Hyundai Electronics Industries Co., Ltd., Kyungi-Do (KR)

( * ) Notice: Subject to any disclaimer, the term of this patent is extended or adjusted under 35 U.S.C. 154(b) by 23 days.

(21) Appl. No.: 09/717,032

(22) Filed: Nov. 22, 2000

(30) Foreign Application Priority Data

Dec. 28, 1999 (KR) ............................................. 99-63889

(51) Int. Cl.⁷ ............................................. H01L 23/48
(52) U.S. Cl. ..................... 257/758; 257/401; 257/322; 257/320; 257/314
(58) Field of Search ............................... 257/758, 401, 257/322, 320, 319; 438/258

(56) References Cited

U.S. PATENT DOCUMENTS 5,309,012 A * 5/1994 Jex et al. .................... 257/401
5,756,385 A * 5/1998 Yuan et al. .................. 438/258
5,761,121 A * 6/1998 Chang .................... 365/185.14

\* cited by examiner

*Primary Examiner*—Richard Elms
*Assistant Examiner*—Douglas Menz
(74) *Attorney, Agent, or Firm*—Pennie & Edmonds LLP

(57) ABSTRACT

A flash memory device is configured to address the problems that charges generated when via hole is etched is charged to a junction region through a metal line and are thus concentrated on a tunnel oxide film, thus making distribution of a threshold voltage over a cell uneven when a device is driven. In order to solve the problems, the device has a junction region in an outside circuit region so charges generated when via hole is etched is concentrated on the junction region formed in the outside circuit region. Thus, it can prevent concentration of the charges on the cell and thus make uniform distribution of the threshold voltage over a cell array.

17 Claims, 4 Drawing Sheets

FLASH MEMORY DEVICE

FIELD OF THE INVENTION

The invention relates generally to a flash memory device. More particularly, the present invention relates to a flash memory device in which over-erase to a cell can be prevented, by prohibiting concentration of charges on a tunnel oxide film.

BACKGROUND OF THE INVENTION

In general, the erase operation of a flash memory cell is performed in sector (cell of 512K) unit. The erase operation is usually performed using F-N tunneling. If charges are accumulated within a tunnel oxide film on a source side of a specific cell, the height of barriers is lowered.

FIGS. 1A and 1B are diagrams for explaining F-N tunneling phenomenon in a flash memory cell.

FIG. 1A shows a F-N tunneling phenomenon in a general flash memory cell. More particularly, it shows that charges stored at a floating gate FG flow toward a source S through a tunnel oxide film 11.

FIG. 1B shows a F-N tunneling phenomenon in the charge-up flash memory cell. The speed of the charges that move from the floating gate FG to the source S becomes higher by positive charges 12 accumulated at the tunnel oxide film 11. As a result, there exists a problem that over-erased cell is generated since its erase speed is higher than that of other cells in which positive charges are not accumulated at the tunnel oxide film.

FIG. 2 is a diagram for explaining a charge-up mechanism in a flash memory cell, which illustrates that charges are concentrated on the tunnel oxide film and the floating gate by means of plasma in a NMOS device.

First, the structure of a typical flash memory cell is explained as follows. A gate electrode, in which a gate oxide film, a floating gate 24, a dielectric film and a control gate 25 are stacked on a P-well 22 formed in a semiconductor substrate 21, is formed, and a junction 23 (source region) is formed in the P-well 22 on both sides of the gate electrode. The source region 23 and a metal line 27 are contacted through a metal contact 26, and the metal line 27 is connected to the outside (decoder, etc.) through via hole 28.

In this structure, etching of the via hole 28 causes positive charges and negative charges to be accumulated at the junction region 23 through the metal line 27. At this time, as the cell shown in FIG. 2 is a N-type, the negative charges flows into the P-well 22 and the semiconductor substrate 21 through the junction region 23, while the positive charges are accumulated at the junction region 23. Thus, over-erased cells are generated since the erase speed of the cell becomes higher by the positive charges accumulated at the junction region 23. This will be explained in detail by reference to FIG. 3.

FIGS. 3A and 3B are a conventional flash memory cell and a layout of a cell array.

FIG. 3A shows a layout of the unit cell, wherein a single cell is mainly consisted of a field oxide film 31, a gate electrode 32, a source S and a drain D.

FIG. 3B shows a layout of a 5×2 memory cell array consisted of the unit cell as shown in FIG. 3A. A first source line S1 in a cell block formed of five (5) unit cells is connected to a second source line S2 in a cell block having the same structure to the first source line S1, and a common source CS line. As explained by reference to FIG. 2, when the via hole 35 is etched, positive charges and negative charges become conductive through the common source line CS and the metal line 27 contacted through the metal contact 34 and thus are accumulated at the common source line CS. At this time, if the cell is a N-type, the negative charges flow into the substrate while the positive charges are accumulated at the common source line CS. The accumulated positive charges are concentrated on the end (edge portion of the sector) of the common source line CS. As a result, the positive charges are accumulated at the tunnel oxide film on the source side and the floating gate of the cell. The positive charges accumulated within the floating gate are neutralized by UV light, but the positive charges within the tunnel oxide film are remained un flowed or not neutralized, thus accelerating the erase speed of the cell.

FIGS. 4A and 4B are distribution of a rapidly erased cell in one sector of a conventional flash memory device and a graph illustrating the relationship between the amount of bit line leak current.

FIG. 4A is a diagram for explaining the distribution of a rapidly erased cell within one sector 41. As explained by reference to FIG. 3, as the positive charges conducted to the source line are concentrated on the end (edge portion of the sector) of the source line, the cells I/O-0, I/O-15 in the region other than the middle region 42 of the sector 41 are rapidly erased, thus causing over-erased cells.

FIG. 4B shows the amount of bit line leak current per I/O when the distribution of the rapidly erased cell is same to FIG. 4A. The graph is the case that a programming operation PGM is performed for 5 $\mu$s, an erase operation is performed for 1 ms, 2 ms, 3 ms era 1 m, era 2 m, era 3 m and a recovery operation rec is performed for 100 $\mu$s, sequentially. From the drawing, it can be seen that a 0 bit line I/O-0; A and a F bit line I/O-15; B, being edge portions of the sector, have a large amount of bit line leak current.

Thus, conventionally, if the entire source lines are not uniformly charged-up since the charges are concentrated on the ends of the source line, the cell in the edge portion of the sector is over-erased. Therefore, there is a problem that reliability of a device is degraded since the bit line leak current is increased.

SUMMARY OF THE INVENTION

It is therefore an object of the present invention to provide a flash memory device, which can prevent concentration of charges on a cell, thus preventing over-erase to the cell and making uniform distribution of a threshold voltage over the cell array.

In order to accomplish the above object, a flash memory device according to the present invention is characterized in that it comprises a flash memory cell formed in a cell array region of a substrate in which the cell array region and an outside circuit region are defined, a source region and a drain region, a junction region formed in the outside circuit region, a first metal contact formed on the source region, second and third metal contacts formed on the junction region, a first metal line connecting the first metal contact and the second metal contact, a second metal line connected to the third metal contact, and a via hole formed on the second metal line.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

In the present invention, in order to prevent charges generated upon etching of a pad from being accumulated at a junction region through a metal line, the junction region is formed at the outside circuit region other than a cell array and a metal line connected to the outside circuit through a via hole is connected to the cell via the junction region formed at the outside circuit region.

The present invention will be described in detail by way of a preferred embodiment with reference to accompanying drawings.

Figure 1A:
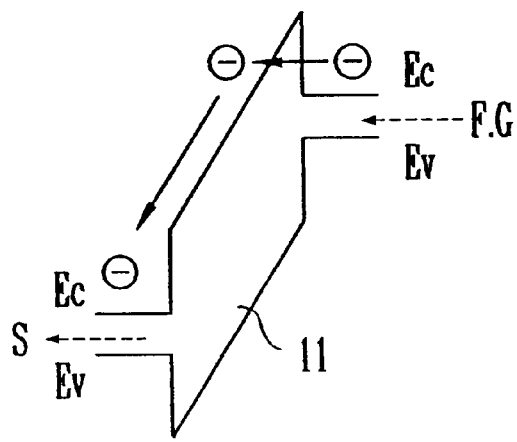
FIGS. 1A and 1B are diagrams for explaining F-N tunneling phenomenon in a flash memory cell.
Figure 1B:
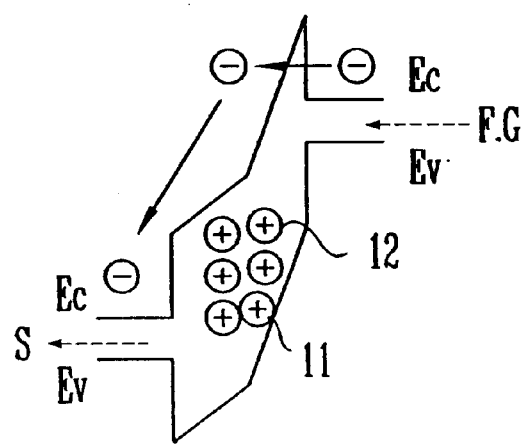
Figure 2:
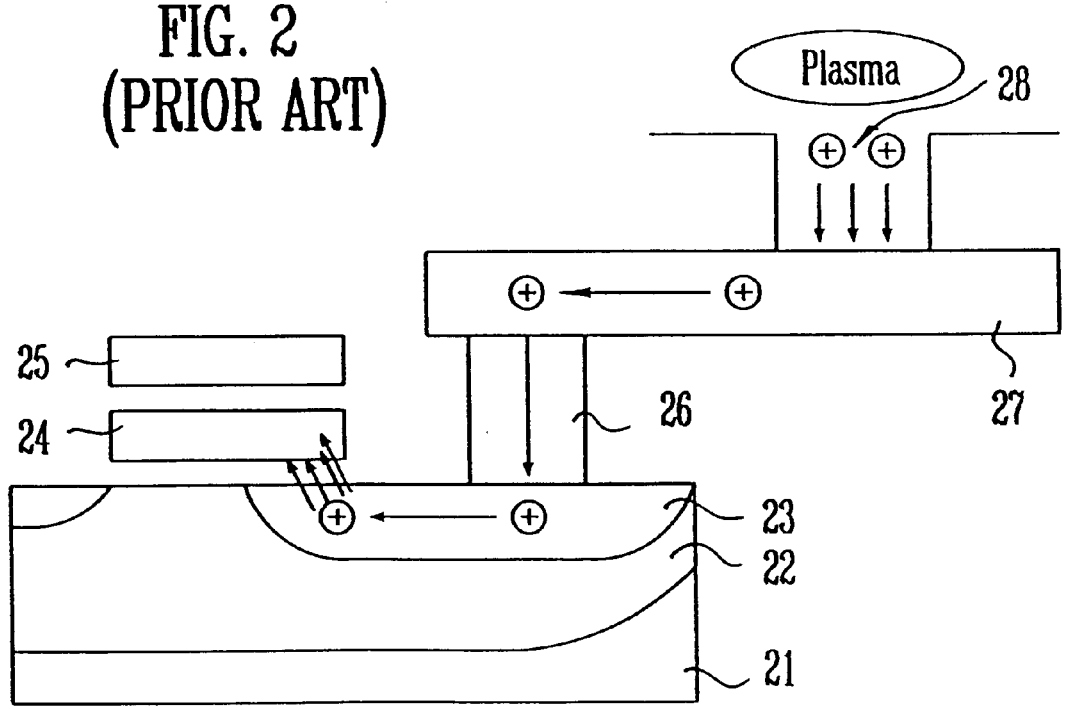
FIG. 2 is a diagram for explaining a charge-up mechanism in a flash memory cell.
Figure 3A:
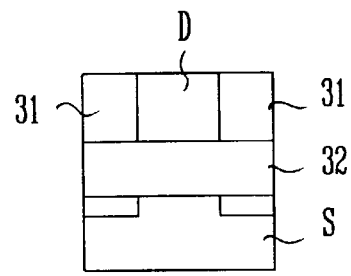
FIGS. 3A and 3B are a conventional flash memory cell and a layout of a cell array.
Figure 3B:
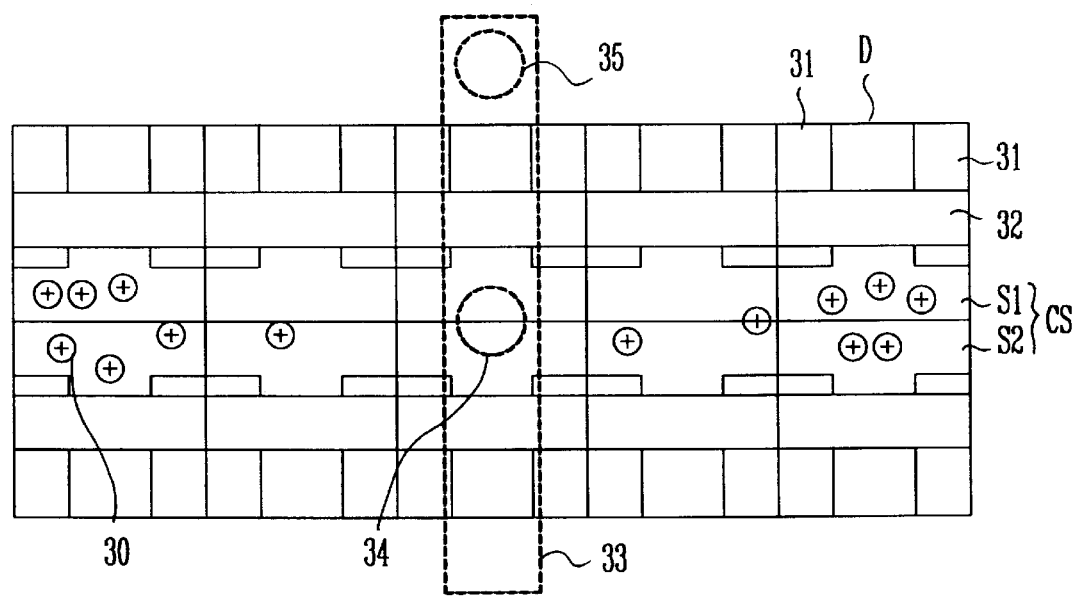
Figure 4A:
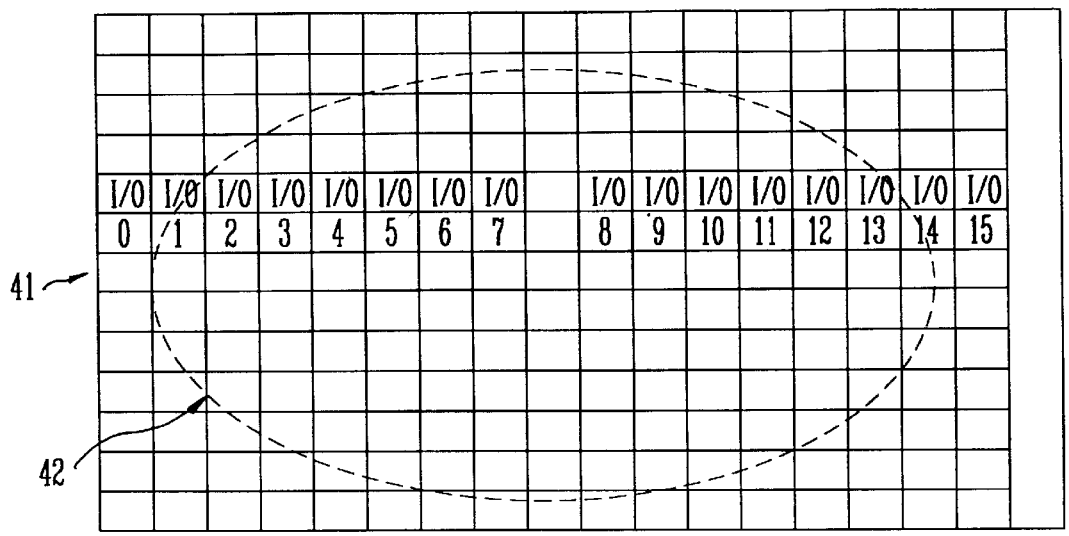
FIGS. 4A and 4B are distribution of a rapidly erased cell in one sector of a conventional flash memory device and a graph illustrating the relationship between the amounts of bit line leak current.
Figure 4B:
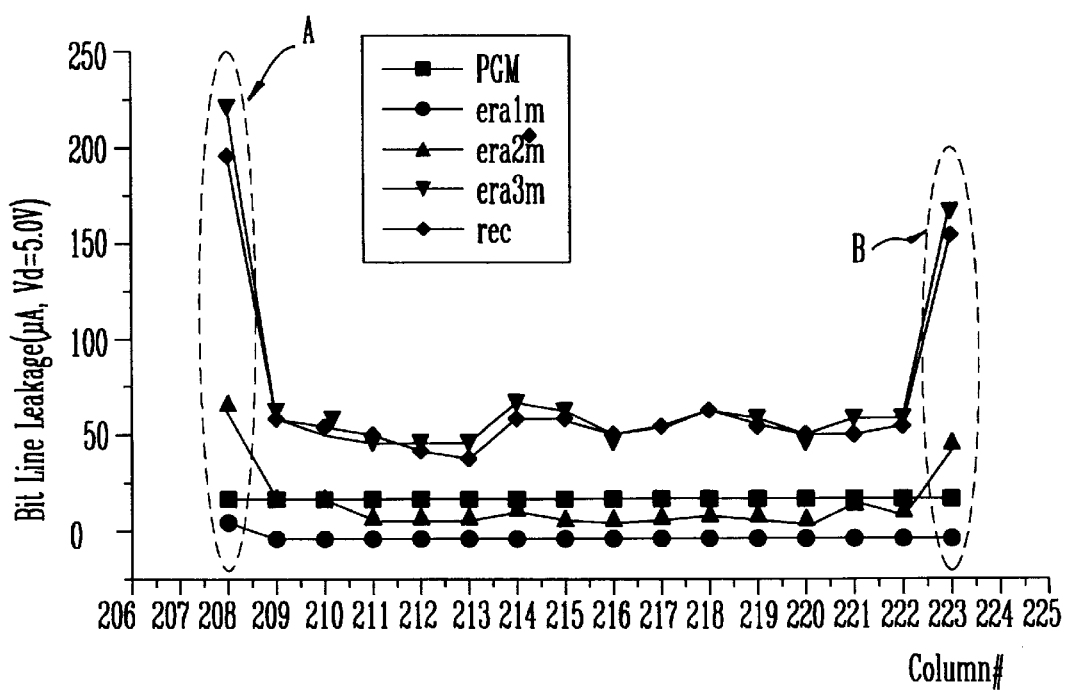
Figure 5:
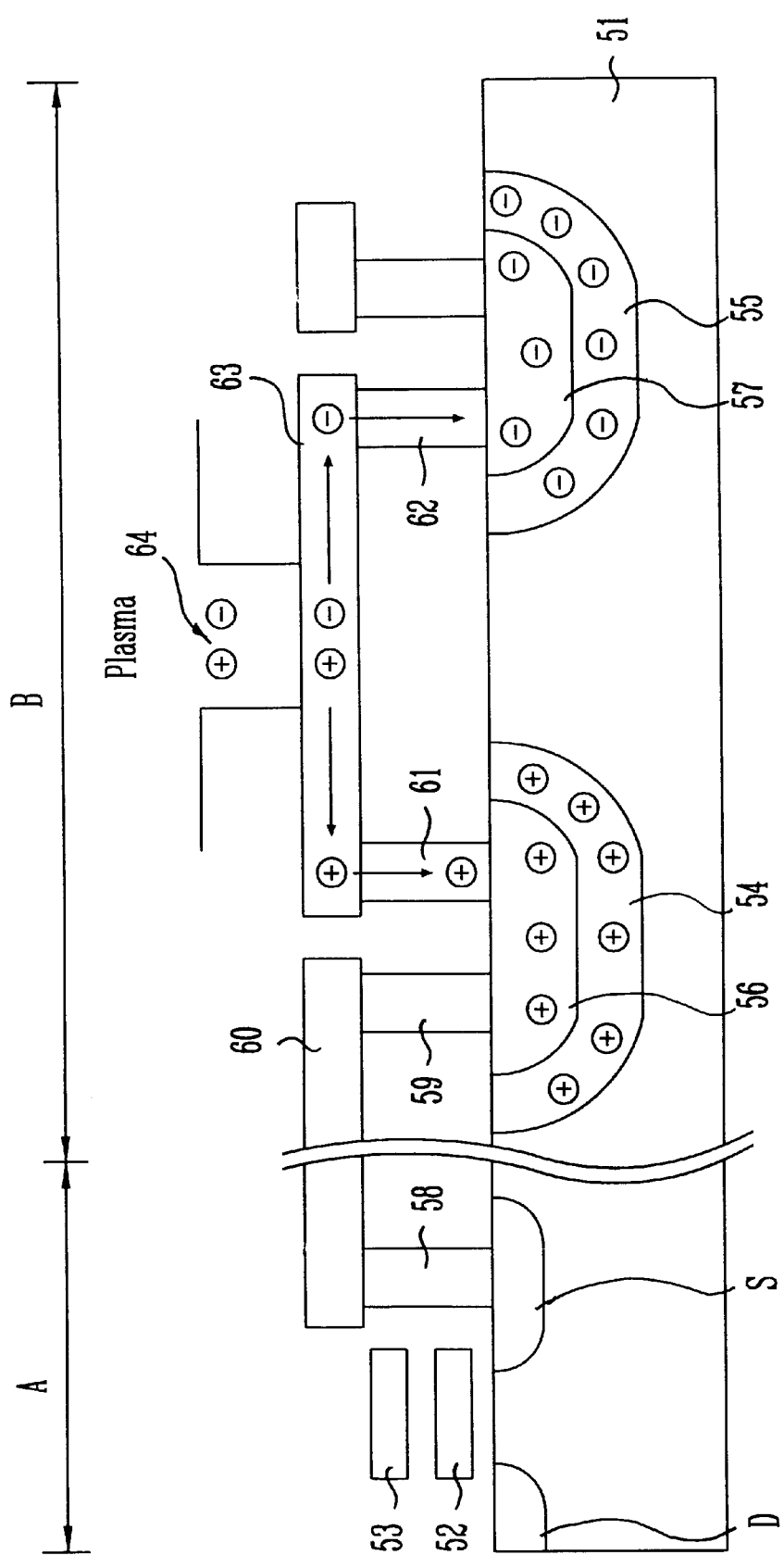
FIG. 5 is a diagram for explaining a structure of a flash memory device according to the present invention.

FIG. 5 is a diagram for explaining a structure of a flash memory device according to an embodiment of the present invention. A NMOS transistor will be below explained for example.

A NMOS transistor consisted of a floating gate 52 and a control gate 53, a source S region and a drain D region are formed in a cell array region A on a substrate 51 in which a cell array region and an outside circuit region are defined. On the other hand, a N-well 54 and a P-well 55 are formed in the outside circuit region B, a $P^+$ junction region 56 is formed within the N-well 54 and a $N^+$ junction region 57 is formed within the P-well 55.

Also, a first metal contact 58 is formed on the cell source S, second and third metal contacts 59 and 61 are formed on the $P^+$ junction 56 and a fourth metal contact 62 is formed on the $N^+$ junction region 57. At this time, the cell source S and the $P^+$ junction region 56 are connected by the first metal line 60 connecting the first and second metal contacts 58 and 59, and the $P^+$ junction region 56 and the $N^+$ junction region 57 are connected by the second metal line 63 connecting the third and fourth metal contacts 61 and 62. As a result, the cell source S is electrically connected to the second metal line 63 through the $P^+$ junction region 56. The via hole 64 for connecting the outside circuit and the cell is formed by exposing the second metal line 63.

The positive and negative charges generated when the via hole 64 is etched, are forced to move toward the cell by a strong negative voltage applied to the control gate 53 in the NMOS transistor upon erase operation of the cell. Thus, as the second metal line is connected to the cell via the $P^+$ junction region 56, the positive charges are concentrated on the P+ junction region 56 and the N-well 54 before they move toward the cell. Thus, concentration of the negative charges on the tunnel oxide film in the NMOS transistor can be prevented. At this time, the negative charges are concentrated on the $N^+$ junction region 57 and the P-well region 55. In this structure, concentration of the positive charges on the cell could be sufficiently prevented by forming only the $P^+$ junction region 56 in the outside circuit region B.

On the other hand, in case of a PMOS transistor, the cell source is connected to the $N^+$ junction region 57 in the outside circuit region B using the first metal line, the $N^+$ junction region 57 is connected to the $P^+$ junction region 56 formed in the outside circuit region B using the second metal line, and the via hole 64 is formed by exposing the second metal line. Upon erase operation of the cell, if a strong positive voltage is applied to the control gate in the PMOS transistor, the negative charges among the charges generated when the via hole is etched move toward the cell. At this time, as the second metal line is connected to the cell via the $N^+$ junction region 57, the negative charges are concentrated on the $N^+$ junction region 57 and the P-well 55 before they move toward the cell. Thus, concentration of the negative charges on the tunnel oxide film in the PMOS transistor can be prevented. At this time, the positive charges are concentrated on the $P^+$ junction region 56 and the N-well 54. In this structure, concentration of the negative charges on the cell can be sufficiently prevented by forming only the $N^+$ junction region 57 in the outside circuit region B.

As described above, the present invention can prevent a cell from being over-erased and thus make uniform the distribution in the threshold voltage of the cell, by preventing charges charged-up in a junction region from being concentrated on a cell array.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A flash memory device, comprising:
    a flash memory cell formed in a cell array region of a substrate in which the cell array region and an outside circuit region are defined, the flash memory cell having a source region and a drain region in said cell array region;
    a first junction region formed in said outside circuit region;
    a first metal contact formed on said source region;
    second and third metal contacts formed on said first junction region;
    a first metal line connecting said first metal contact and said second metal contact;
    a second metal line connected to said third metal contact; and
    a via hole formed on said second metal line.

2. The flash memory device according to claim 1, wherein said first junction region has a $P^+$ junction structure if said flash memory cell is N-type, and has a $N^+$ junction structure if said flash memory cell is P-type.

3. The flash memory device according to claim 1, wherein said first junction region is surrounded by at least one well.

4. A flash memory device, comprising:
    a flash memory cell formed in a cell array region of a substrate in which the cell array region and an outside circuit region are defined, the flash memory cell having a source region and a drain region in said cell array region;
    first and second junction regions formed in said outside circuit region;
    a first metal contact formed on said source region;
    second and third metal contacts formed on said first junction region and a fourth metal contact formed on said second junction region;

a first metal line connecting said first metal contact and said second metal contact;

a second metal line connecting said third metal contact and said fourth metal contact; and a via hole formed on said second metal line.

5. The flash memory device according to claim 4, wherein said first and second junction regions have different conductive types.

6. The flash memory device according to claim 4, wherein each of said first and second junction regions is surrounded by at least one well.

7. The flash memory device according to claim 4, wherein said first junction region has a $P^+$ junction structure and said second junction region has a $N^+$ junction structure, if said memory cell is N-type.

8. The flash memory device according to claim 1, wherein said first junction region has a $N^+$ junction structure and said second junction region has a $P^+$ junction structure, if said memory cell is P-type.

9. A flash memory device, comprising:

a substrate having a cell array region and an outside circuit region;

a flash memory cell having an associated source region and a drain region, all formed in the cell array region;

a first junction region formed in the outside circuit region;

a first metal contact formed on the source region;

second and third metal contacts formed on the first junction region;

a first metal line connecting the first metal contact to the second metal contact;

a second metal line connected to the third metal contact; and a via hole formed on the second metal line.

10. The flash memory device according to claim 9, wherein the first junction region has a $P^+$ junction structure if the flash memory cell is N-type, and has a $N^+$ junction structure if the flash memory cell is P-type.

11. The flash memory device according to claim 9, wherein the first junction region is surrounded by at least one well.

12. The flash memory device according to claim 9, wherein the second metal line is present only in the outside circuit region.

13. The flash memory device according to claim 9, further comprising:

a second junction region formed in the outside circuit region and spaced apart from the first junction region; and a fourth metal contact connecting the second metal line to the second junction region, wherein
the second metal line connects third metal contact to the fourth metal contact.

14. The flash memory device according to claim 13, wherein the first and second junction regions have different conductive types.

15. The flash memory device according to claim 13, wherein each of said first and second junction regions is surrounded by at least one well.

16. The flash memory device according to claim 13, wherein the first junction region has a $P^+$ junction structure and the second junction region has a $N^+$ junction structure, if the memory cell is N-type.

17. The flash memory device according to claim 13, wherein the first junction region has a $N^+$ junction structure and the second junction region has a $P^+$ junction structure, if the memory cell is P-type.

\* \* \* \* \*